(12) United States Patent
Lee

(10) Patent No.: US 7,544,446 B2
(45) Date of Patent: Jun. 9, 2009

(54) MASKS OF SEMICONDUCTOR DEVICES AND METHODS OF FORMING PATTERNS THEREOF

(75) Inventor: Jun Seok Lee, Goyang (KR)

(73) Assignee: Dongbu Electronics Co., Ltd. (KR)

( * ) Notice: Subject to any disclaimer, the term of this patent is extended or adjusted under 35 U.S.C. 154(b) by 719 days.

(21) Appl. No.: 11/023,276

(22) Filed: Dec. 27, 2004

(65) Prior Publication Data

US 2005/0175145 A1    Aug. 11, 2005

(30) Foreign Application Priority Data

Dec. 27, 2003    (KR)    ............... 10-2003-0098324

(51) Int. Cl.
*G03F 1/00*    (2006.01)
(52) U.S. Cl. .......................................... 430/5
(58) Field of Classification Search ................ 430/5
See application file for complete search history.

(56) References Cited

U.S. PATENT DOCUMENTS

| | | | | |
|---|---|---|---|---|
| 5,496,666 | A * | 3/1996 | Chu et al. ............. | 430/5 |
| 7,214,453 | B2 * | 5/2007 | Yamazoe et al. ........ | 430/5 |
| 2001/0049064 | A1 * | 12/2001 | Lee et al. ............. | 430/5 |
| 2005/0089766 | A1 * | 4/2005 | Woo et al. ............ | 430/5 |

* cited by examiner

*Primary Examiner*—Mark F Huff
*Assistant Examiner*—Stewart A Fraser
(74) *Attorney, Agent, or Firm*—Andrew D. Fortney

(57) ABSTRACT

Disclosed are a mask of a semiconductor device and a method for forming a pattern thereof, which is capable of correcting a line width bias between a long line width and a short line width when a mask of a semiconductor transistor is formed. The mask may include a plurality of rectangular light shielding patterns formed on a mask disc on which gate line and contact holes are formed; and a connection pattern composed of a plurality of division patterns for selectively connecting the plurality of rectangular light shielding patterns one another. The plurality of rectangular light shielding patterns overlap with the contact hole mask and are formed on both sides of the connection pattern. The connection pattern is divided into 3 to 7 division patterns.

17 Claims, 4 Drawing Sheets

MASKS OF SEMICONDUCTOR DEVICES AND METHODS OF FORMING PATTERNS THEREOF

TECHNICAL FIELD

The present disclosure relates to semiconductor devices and, more particularly, to masks of semiconductor devices and a methods of forming patterns thereof.

BACKGROUND

In general, a mask pattern formation technique employed in fabricating a semiconductor device has a significant affect on accuracy of a pattern formed on the semiconductor device. Particularly, if transmissivity of a mask pattern is not properly considered, a process margin is insufficient, and distortion of a pattern line width, such as shortening of linearity of the line width, occurs contrary to the original purpose of lithographic exposure, which results in deterioration of characteristics of the semiconductor device.

On the other hand, a semiconductor photolithography technique can properly adjust the amount of light passing through a mask by designing the mask elaborately. To this end, an optical proximity correction technique and a phase shifting mask technique have been introduced and various methods for minimizing light distortion due to deformation of a mask pattern have been developed.

Recently, with the development of chemically amplified resists that are very sensitive to light having a far-ultraviolet wavelength of 248 nanometers (nm) or 194 nm, practical techniques for enhancing a resolution have been introduced. Particularly, a technique for forming an auxiliary pattern, which is separated from a main pattern, such as a dummy pattern used to control an optical proximity effect, contributes to enhancement of resolution.

FIGS. 1a and 1b are diagrams showing a long line width and a short line width of an active transistor of a conventional semiconductor mask, respectively.

First, FIG. 1 shows a long line width of about 10 micrometers (μm) of the active transistor of the semiconductor mask. Typically, it is very important to secure the line width of the active transistor overlapping with a gate transistor for normal electrical operation of a gate device. A factor to determine such a characteristic electrically is a characteristic of a high voltage transistor.

The active transistor is composed of portions 2L and 2R in which contact holes 5L and 5R are to be formed and a transistor portion overlapping with a gate transistor. Here, a contour image 4a formed by an exposure apparatus is also shown. In addition, because the active transistor is sufficiently long in its longitudinal direction, a uniform line width is maintained long, as denoted by reference A.

FIG. 1b shows an active transistor related to a low voltage transistor, with a line width designed in the same way as FIG. 1 and with its length decreased. As shown in FIG. 1b, the length of the line width measured on a semiconductor substrate is greatly different from that of the line width in FIG. 1a. Namely, as the line width becomes shortened in its longitudinal direction, the optical proximity effect occurs greatly and the line width is formed somewhat large. Here, a contour image 4b is also shown in FIG. 1b.

In this case, because a transistor portion 3 overlapping with the gate transistor is short in its longitudinal direction, a portion where the line width is uniformly maintained is very short, as denoted by reference B, and electrical characteristics also become unstable. Accordingly, it is difficult to properly fit a characteristic curve for a ratio of breakdown voltage ($V_{tl}$) to gate line width or a ratio of saturation current ($I_{dsat}$) to gate line width.

FIG. 2 is a diagram illustrating optical proximity correction (OPC) applied to enhance a line width of a transistor in the prior art.

As shown in FIG. 2, although the OPC is applied to enhance the line width of the transistor, it is not easy to adjust the linearity of the line width uniformly. This is because patterns to which OPC for line width is applied in programs in common use are corrected by a single way independent of the length of the patterns. Accordingly, correction accuracy is deteriorated when the lengths of line width are different, as described above. Here, reference numeral ML denotes an OPC line width of the active transistor and reference numeral GW denotes a line width of the gate transistor. Particularly, when the line width GW of the gate transistor is wide and the line width ML of the active transistor is narrow, there is a problem in that electrical characteristic are deteriorated.

SUMMARY

The present invention is directed to a mask used in fabricating a semiconductor device and a method for the same that substantially obviates one or more problems due to limitations and disadvantages of the related art. An object of the present invention is to provide a mask that is capable of minimizing a line width bias between a long line width and a short line width when a mask of a semiconductor transistor is formed. Another object of the present invention is to optimize a breakdown voltage and saturation current in a portion overlapping with a gate transistor by uniformly maintaining the line width of a small-scale transistor.

Embodiments of the present invention relate to a mask used in fabricating a semiconductor device comprising a plurality of rectangular light shielding patterns formed on a mask disc and a connection pattern comprising a plurality of division patterns for selectively connecting the plurality of rectangular light shielding patterns to one another. Further embodiments of the present invention relate to a method of forming a mask pattern used in fabricating a semiconductor device comprising forming a plurality of rectangular light shielding patterns on a mask disc, and forming a plurality of division patterns for selectively connecting the plurality of rectangular light shielding patterns to one another.

DETAILED DESCRIPTION

A mask of a semiconductor device and a method for forming a pattern thereof, which is capable of correcting a line width bias between a long line width and a short line width when a mask of a semiconductor transistor is formed, is described in detail with reference to the accompanying drawings.

In order to overcome the problem of a conventional small transistor, first, a portion of an active transistor overlapping with a gate line is divided into four division patterns 3a, 3b, 7a and 7b. At this time, the division patterns 3a, 3b, 7a and 7b are arranged with a gap of 0.05 μm therebetween, for example. Of these division patterns, a first division pattern 7a-b has the same line width (vertical length of the division patterns) as in an original design drawing.

At this time, resolution of the division patterns can be defined by a Rayleigh's equation as expressed by Equation 1.

$$R(\text{Resolution}) = k * \lambda / N.A. \quad \text{Equation 1}$$

Where, k is constant, λ is a wavelength of light emitted from an illuminometer, and N.A. is an aperture of an illuminating lens. For example, when k is 0.5, λ is 0.248, and N.A. is 0.65, resolution (R)=0.19 μm. Accordingly, when a fine pattern having a line width less than the value of the resolution is independently applied to a mask, a pattern for passing light through only the mask physically while an image is not formed in a photosensitive agent can be defined.

Figure 1A:
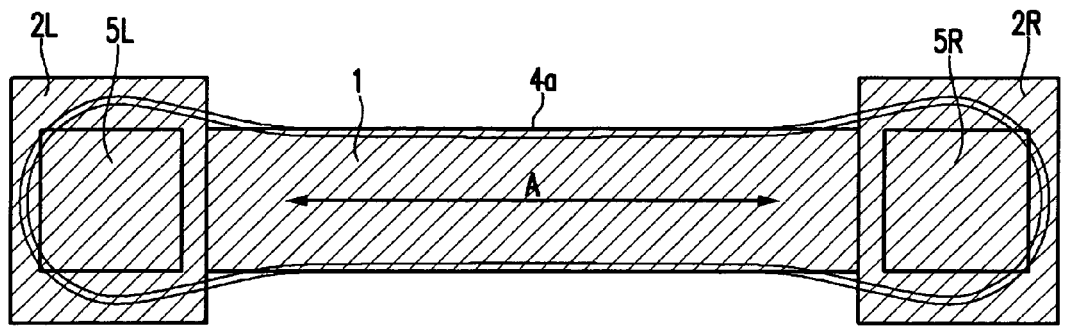
FIGS. 1a and 1b are diagrams showing a long line width and a short line width of an active transistor of a conventional semiconductor mask, respectively.
Figure 1B:
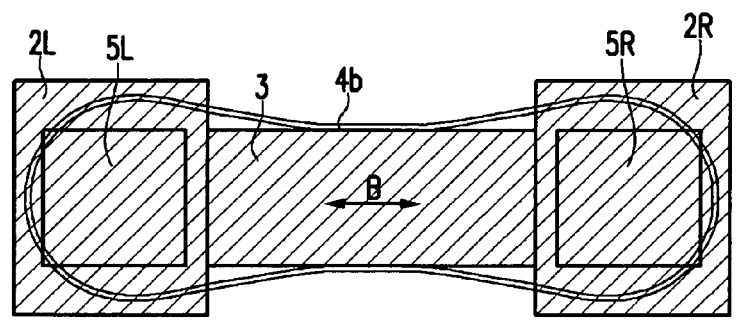
Figure 2:
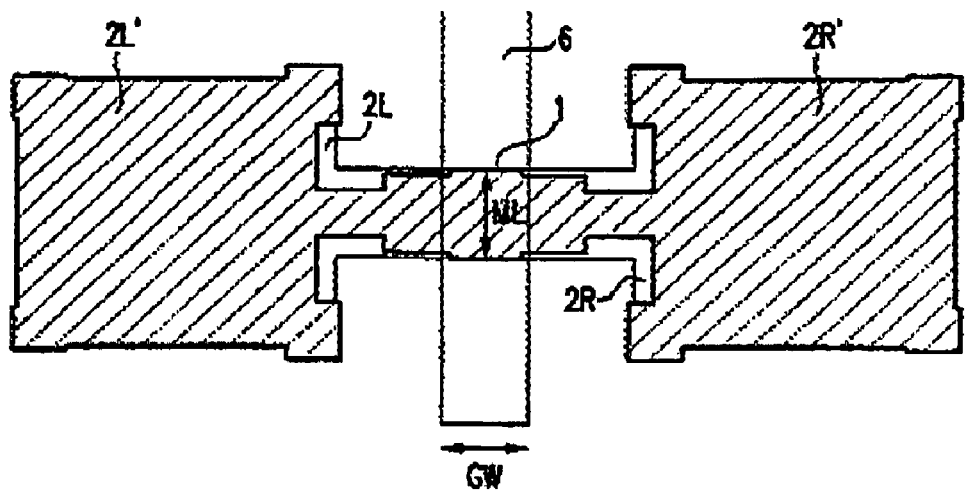
FIG. 2 is a diagram illustrating OPC applied in a known manner to enhance a line width of a transistor.
Figure 3:
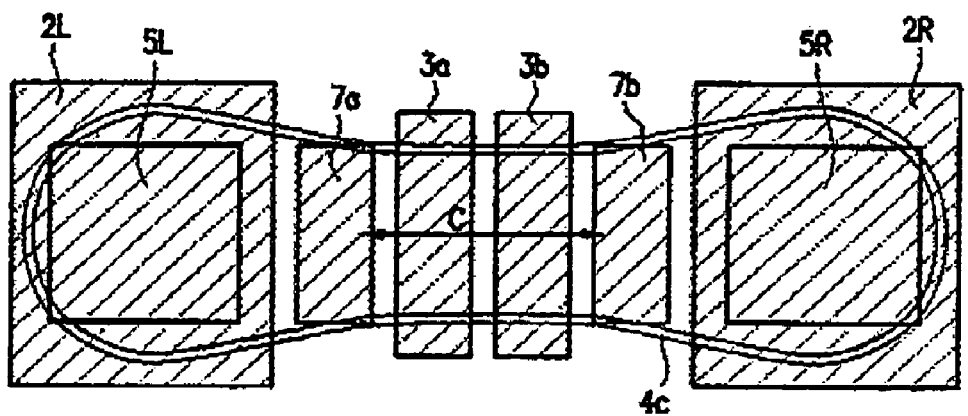
FIG. 3 is a diagram illustrating a first example mask of a semiconductor device.

Referring to FIG. 3 again, of the division patterns, second patterns 3a and 3b are arranged to be longer by about 0.04 μm than the vertical length of the first pattern 7a-b in the vertical direction.

In this way, OPC can be applied minimally and the line width can be adjusted very elaborately. In addition, as denoted by reference numeral C, uniformity of the line width can be greatly improved as shown in a contour image 4c.

Figure 4:
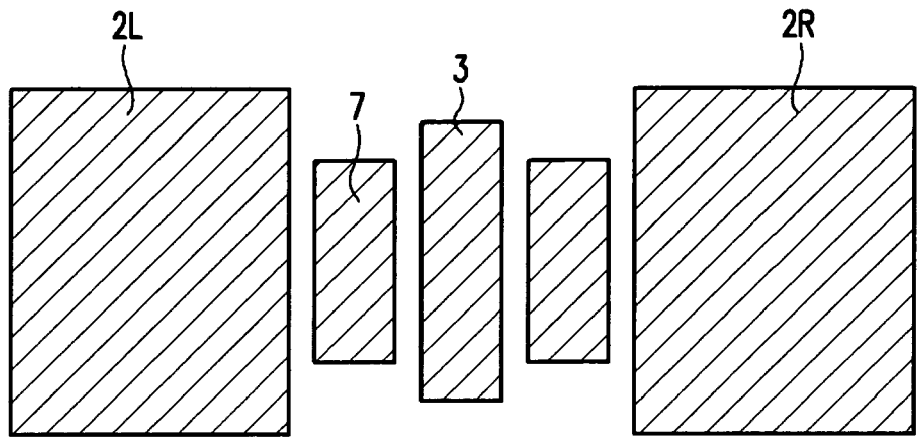
FIG. 4 is a diagram illustrating a second example mask of a semiconductor device.

FIG. 4 is a diagram illustrating a second example mask of a semiconductor device. In the arrangement of FIG. 4, three division patterns 3 and 7 are formed and a line width is adjusted by a middle division pattern 3.

Figure 5:
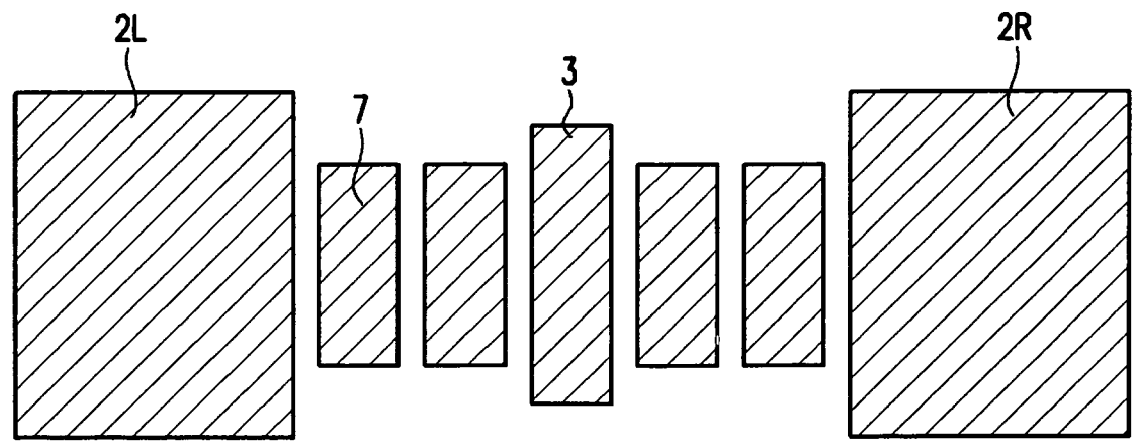
FIG. 5 is a diagram illustrating a third example mask of a semiconductor device.

FIG. 5 is a diagram illustrating a third example mask of a semiconductor device. In the arrangement of FIG. 5, five division patterns 3 and 7 are formed and a line width is adjusted by a middle division pattern 3.

Figure 6:
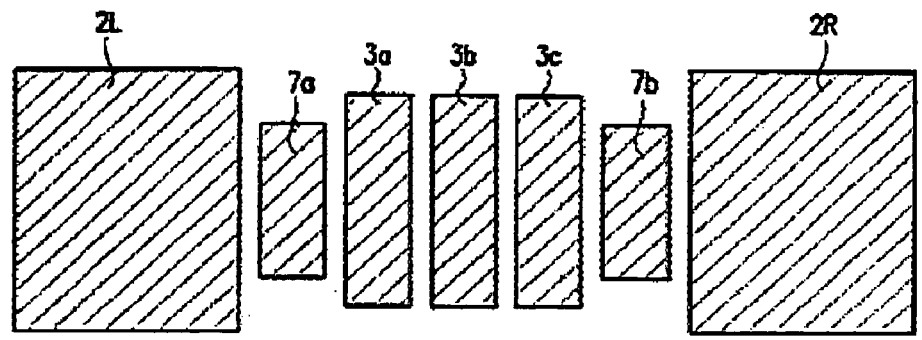
FIG. 6 is a diagram illustrating a fourth example mask of a semiconductor device.

FIG 6 is a diagram illustrating a fourth example mask of a semiconductor device, wherein five division patterns 3a, 3b, 3c, 7a and 7b are formed and a line width is adjusted by middle division patterns 3a, 3b and 3c.

Figure 7:
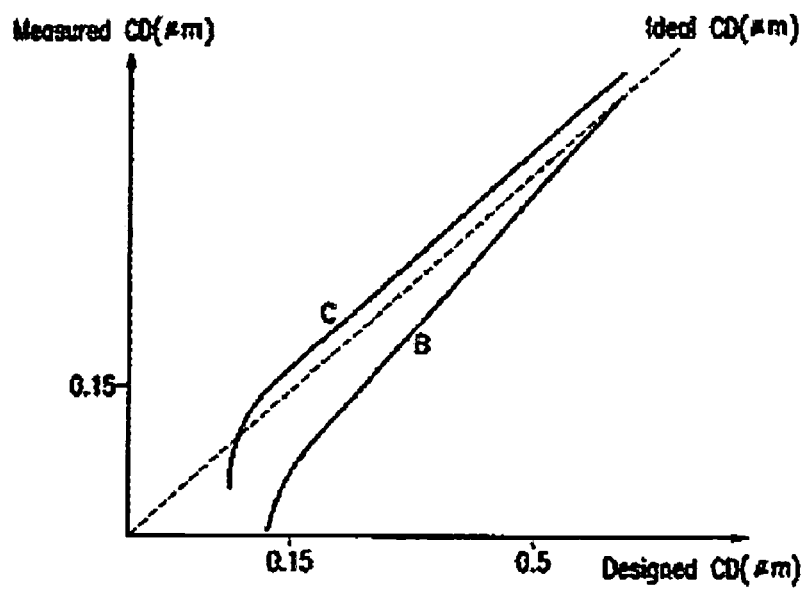
FIG. 7 is a graphical diagram showing line width linearity when a line width of an active transistor is gradually increased, as disclosed herein.

FIG. 7 is a graphical diagram showing line width linearity when a line width of an active transistor is gradually increased, as disclosed herein. In the graphical diagram, a B curve shows a result of application of the conventional method and a C curve shows a result of selective application of the disclosed division patterns. The disclosed techniques and patterns can minimize the line width bias between the small-scale transistor and the transistor having a large length by selectively dividing the line width of the small-scale transistor in the active region.

As is apparent from the above description, because a line width of a small-scale transistor in an active region is selectively divided, a line width bias between the line width of the small-scale transistor and a transistor having a large length can be minimized. In addition, because the line width of the small-scale transistor can be maintained uniformly, a breakdown voltage and saturation current in a portion overlapping with a gate transistor can be optimized.

In addition, because electrical characteristics of NMOS and PMOS in memory devices can be maintained symmetrically, the yield of devices can be enhanced.

As disclosed herein, a mask of a semiconductor device and a method for forming a pattern thereof, which is capable of forming an accurate line width by correcting a line width bias between a long line width and a short line width when a mask of a semiconductor transistor is formed.

According to one example, a mask of a semiconductor device may include a plurality of rectangular light shielding patterns formed on a mask disc on which gate line and contact holes are formed; and a connection pattern composed of a plurality of division patterns for selectively connecting the plurality of rectangular light shielding patterns one another.

In one example, the plurality of rectangular light shielding patterns overlap with the contact hole mask and are formed on both sides of the connection pattern. Additionally, the connection pattern may be divided into 3 to 7 division patterns.

In one arrangement, at least one of the plurality of division patterns overlaps with the gate line. The division pattern overlapping with the gate line may have a length selectively different from those of division patterns, which do not overlap with the gate line.

According to a second example, there is provided a method for forming a mask pattern for a semiconductor device. Such a method may also include forming a plurality of rectangular light shielding patterns on a mask disc on which gate line and contact holes are formed; and forming a plurality of division patterns for selectively connecting the plurality of rectangular light shielding patterns one another.

In one example, the plurality of rectangular light shielding patterns overlap with the contact hole mask and are formed on both sides of the plurality of division pattern. Additionally, the plurality of division pattern may be divided into 3 to 7 division patterns.

With the configurations as above, because a line width of a small-scale transistor in an active region is selectively divided, a line width bias between the line width of the small-scale transistor and a transistor having a large length can be minimized. In addition, because the line width of the small-scale transistor can be maintained uniformly, a breakdown voltage and saturation current in a portion overlapping with a gate transistor can be optimized.

This patent application makes reference to, incorporates the same herein, and claims all benefits accruing under 35 U.S.C. §119 from an application for MASK OF SEMICONDUCTOR DEVICE AND METHOD FOR FORMING PATTERN THEREOF filed in the Korean Industrial Property Office on Dec. 27, 2003 and there duly assigned Serial No. 10-2003-0098324.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A mask used in fabricating a CMOS semiconductor device, comprising:

a plurality of rectangular light shielding patterns on a mask; and a connection pattern comprising three or more rectangular division patterns between the plurality of rectangular light shielding patterns, wherein at least one of the rectangular division patterns has a greater vertical length than at least two other rectangular division patterns, and the vertical lengths of the rectangular division patterns correspond to a gate line width.

2. The mask of claim 1, wherein the plurality of rectangular light shielding patterns overlap with a contact hole mask and are on both sides of the connection pattern.

3. The mask of claim 1, wherein the connection pattern consists of 3 to 7 rectangular division patterns.

4. The mask of claim 1, wherein at least one of the rectangular division patterns overlaps with the gate line.

5. A method for forming a mask pattern used in fabricating a CMOS semiconductor device, comprising:
   forming a plurality of rectangular light shielding patterns on a mask;
   forming a connection pattern comprising three or more rectangular division patterns for between the plurality of rectangular light shielding patterns, wherein at least one of the rectangular division patterns has a greater vertical length than at least two other rectangular division patterns, and the vertical lengths of the rectangular division patterns correspond to a gate line width;
   forming a gate line in a region of the CMOS semiconductor device between regions corresponding to the plurality of rectangular light shielding patterns; and
   forming contact holes in regions of the CMOS semiconductor device corresponding to the plurality of rectangular light shielding patterns.

6. The method of claim 5, wherein the plurality of rectangular light shielding patterns overlap with a contact hole mask and are on both sides of the plurality of division pattern.

7. The method of claim 5, wherein connection pattern consists of 3 to 7 division patterns.

8. The mask of claim 1, wherein a width of the connection pattern is less than a width of a corresponding rectangular light shielding pattern.

9. The mask of claim 1, wherein each of the plurality of rectangular light shielding patterns overlap with a contact hole.

10. The method of claim 5, further comprising forming rectangular light shielding patterns on opposite sides of the connection pattern.

11. The mask of claim 3, wherein at least one of the rectangular division patterns overlaps with the gate line.

12. The mask of claim 11, wherein each of the rectangular division pattern overlaps with the gate line.

13. The mask of claim 4, wherein each of the at least one rectangular division pattern overlaps with the gate line.

14. The mask of claim 1, wherein a gate line is formed in a region of the CMOS semiconductor device between regions corresponding to the plurality of rectangular light shielding patterns.

15. The mask of claim 1, wherein contact holes are formed in regions of the CMOS semiconductor device corresponding to the plurality of rectangular light shielding patterns.

16. The mask of claim 4, wherein at least two rectangular division patterns do not overlap with the gate line.

17. The mask of claim 3, wherein at least two rectangular division patterns do not overlap with the gate line.

* * * * *